(12) United States Patent
Sa et al.

(10) Patent No.: US 9,337,228 B2
(45) Date of Patent: May 10, 2016

(54) STACK CHIP PACKAGE IMAGE SENSOR

(71) Applicant: SiliconFile Technologies Inc., Seongnam-si, Gyeonggi-do (KR)

(72) Inventors: Seung Hoon Sa, Seongnam-si (KR); Young Ha Lee, Seongnam-si (KR)

(73) Assignee: SiliconFile Technologies Inc., Gyeonggi-do (KR)

( * ) Notice: Subject to any disclaimer, the term of this patent is extended or adjusted under 35 U.S.C. 154(b) by 0 days.

(21) Appl. No.: 14/468,843

(22) Filed: Aug. 26, 2014

(65) Prior Publication Data

US 2015/0060968 A1 Mar. 5, 2015

(30) Foreign Application Priority Data

Sep. 2, 2013 (KR) .......................... 10-2013-0104653

(51) Int. Cl.
*H01L 27/148* (2006.01)
*H01L 27/146* (2006.01)

(52) U.S. Cl.
CPC ...... *H01L 27/14636* (2013.01); *H01L 27/1464* (2013.01); *H01L 27/14609* (2013.01); *H01L 27/14634* (2013.01)

(58) Field of Classification Search
CPC ................ H01L 27/146; H01L 27/148; H01L 27/14605; H01L 27/14609; H01L 27/14643; H01L 27/14868
See application file for complete search history.

(56) References Cited

U.S. PATENT DOCUMENTS

2010/0097490 A1* 4/2010 Ahn .................. H01L 27/14634
                                                        348/222.1
2014/0042582 A1* 2/2014 Kondo .................... H01L 31/02
                                                        257/443

FOREIGN PATENT DOCUMENTS

| JP | 2011-228621 | 11/2011 |
| KR | 10-2008-0061027 | 7/2008 |
| KR | 10-2010-0078719 | 7/2010 |
| KR | 10-2010-0102043 | 9/2010 |
| KR | 10-1062333 | 9/2011 |

* cited by examiner

*Primary Examiner* — Jae Lee
(74) *Attorney, Agent, or Firm* — IP & T Group LLP (57) ABSTRACT

An image sensor cell is divided into two chips, and a capacitor for noise reduction is formed in a bottom wafer in correspondence with a unit pixel of a top wafer in a stack chip package image sensor having a coupling structure of the two chips, so that noise characteristics of the image sensor are improved. A stack chip package image sensor includes: a first semiconductor chip that includes a photodiode, a transmission transistor, and a first conductive pad and outputs image charge, which is output from the photodiode, through the first conductive pad; and a second semiconductor chip that includes a drive transistor, a selection transistor, a reset transistor, and a second conductive pad and supplies a corresponding pixel with an output voltage corresponding to the image charge received from the first semiconductor chip through the second conductive pad. The second semiconductor chip includes a capacitor for noise reduction.

11 Claims, 9 Drawing Sheets

STACK CHIP PACKAGE IMAGE SENSOR

BACKGROUND

1. Technical Field

The present disclosure relates to an image sensor, and more particularly, to a stack chip package image sensor in which a capacitor for noise reduction is formed in a bottom wafer in correspondence with a unit pixel of a top wafer, so that it is possible to improve noise characteristics of the image sensor.

2. Related Art

In general, a CMOS image sensor (CIS) may be classified into a FSI (Front Side Illumination) image sensor and a BSI (Back Side Illumination) image sensor.

In a conventional FSI CMOS image sensor, it is not possible to arrange a capacitor for noise reduction in each unit pixel due to a structural problem. Recently, high pixel and pixel miniaturization have been demanded for the FSI CMOS image sensor. However, such a CMOS image sensor has an insufficient space where a capacitor for noise reduction may be arranged in each unit pixel.

Figure 1:
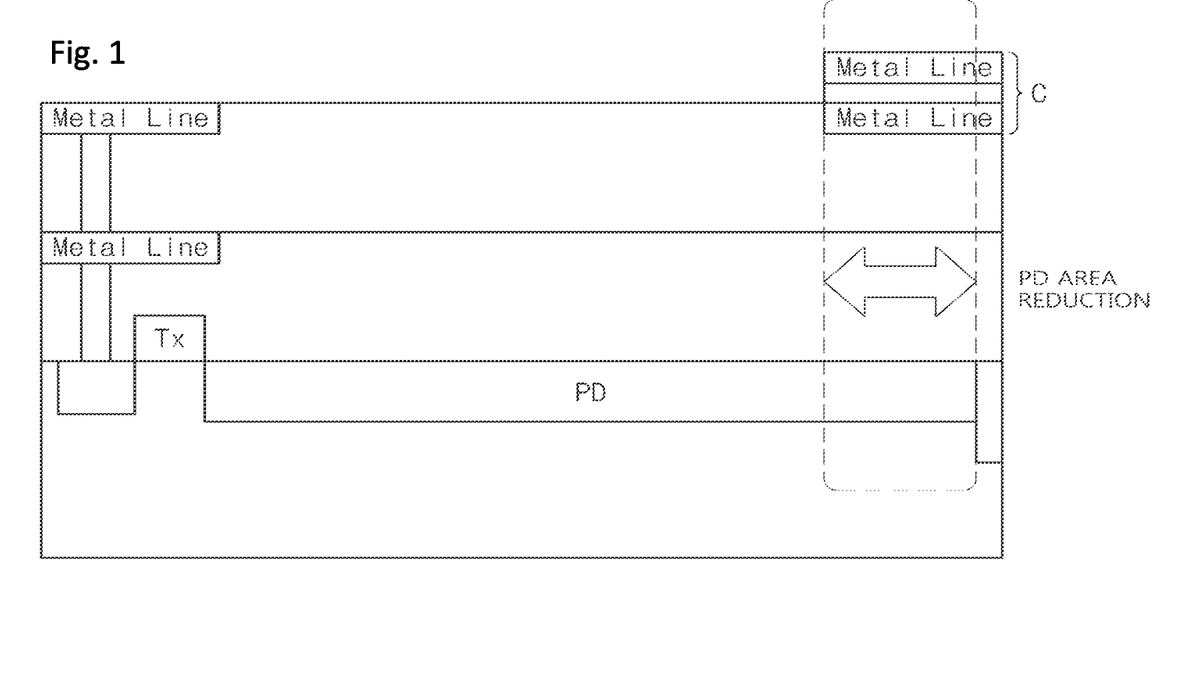
FIG. 1 is a sectional view of a conventional FSI CMOS image sensor including a capacitor for noise reduction.
Figure 2:
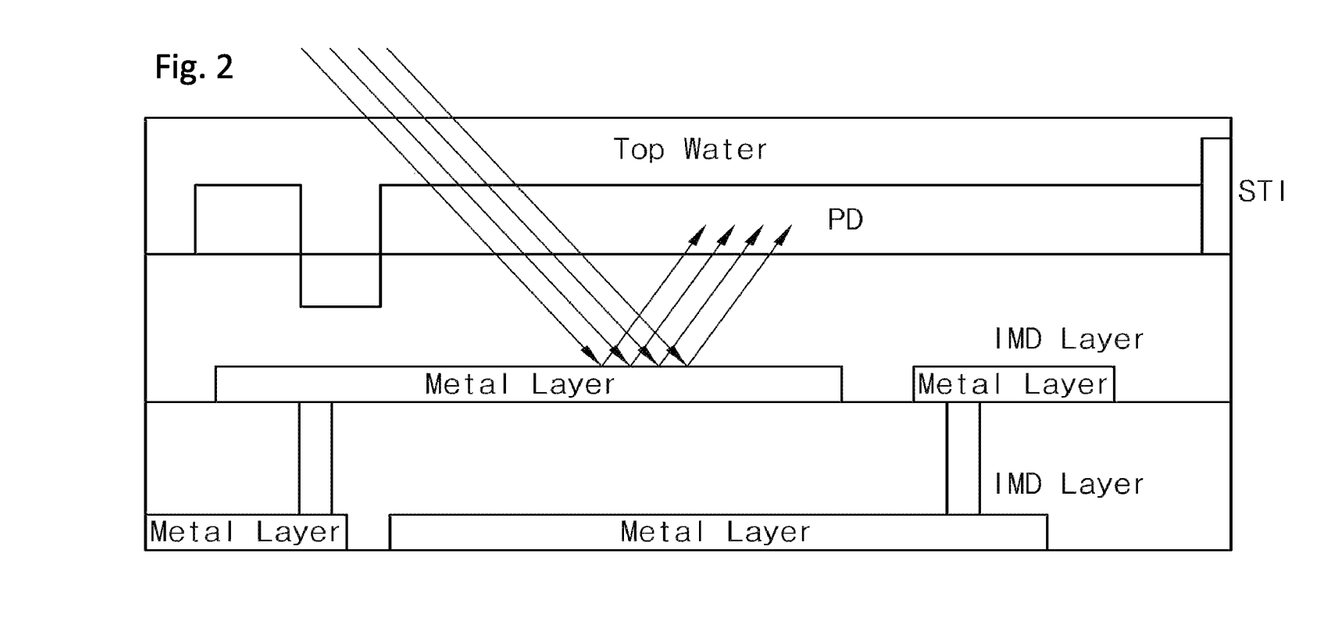
FIG. 2 is a sectional view of a conventional BSI CMOS image sensor including a capacitor for noise reduction.

In spite of the problem, when a capacitor for noise reduction is arranged in the FSI CMOS image sensor, a capacitor C for noise reduction may be arranged on an incident path of a photodiode PD in a MIM (Metal Insulator Metal) or MOM (Metal on Metal) structure as illustrated in FIG. 1.

In such a case, there is a problem that a light incident area of the photodiode PD is reduced inversely proportional to an installation area of the capacitor for noise reduction. Therefore, in the FSI CMOS image sensor, it is not possible to arrange the capacitor for noise reduction.

However, in the case of a conventional BSI CMOS image sensor, a capacitor for noise reduction may be formed in a rear direction of a photodiode PD by using a metal layer with a MIM or MOM structure on the basis of incident light. Consequently, the capacitor for noise reduction is formed, so that it is possible to prevent an area of the photodiode PD from being reduced.

However, in such a case, there is a problem that the incident light may be reflected from the surface of the metal layer and thus crosstalk may occur. Furthermore, since the capacitor for noise reduction is formed in the MIM or MOM structure in order to maximally reduce the size of an image sensor chip, it is difficult to design the capacity or the capacitor for noise reduction at a desired value.

SUMMARY

Various embodiments are directed to divide an image sensor cell into two chips and form a capacitor for noise reduction in a bottom wafer in correspondence with a unit pixel of a top wafer in a stack chip package image sensor having a coupling structure of the two chips, thereby improving noise characteristics of the image sensor.

In an embodiment, a stack chip package image sensor includes: a first semiconductor chip that includes a photodiode, a transmission transistor, and a first conductive pad and outputs image charge, which is output from the photodiode, through the first conductive pad; and a second semiconductor chip that includes a drive transistor, a selection transistor, a reset transistor, and a second conductive pad and supplies a corresponding pixel with an output voltage corresponding to the image charge received from the first semiconductor chip through the second conductive pad, wherein the second semiconductor chip includes: a capacitor for noise reduction that reduces noise component added to the output voltage supplied to the pixel.

In an embodiment, a stack chip package image sensor includes: a first semiconductor chip that includes a photodiode, a transmission transistor, a reset transistor, and a first conductive pad, outputs image charge, which is output from the photodiode, through the first conductive pad, and further includes a first capacitor for noise reduction for reducing noise existing on a path of a power supply, the reset transistor, and the first conductive pad; and a second semiconductor chip that includes a drive transistor, a selection transistor, and a second conductive pad, supplies a corresponding pixel with an output voltage corresponding to the image charge received from the first semiconductor chip through the second conductive pad, and further includes a second capacitor for noise reduction for reducing noise existing on a path of the power supply, the drive transistor, the selection transistor, and the output voltage.

According to the present invention, an image sensor cell is divided into two chips, and a capacitor for noise reduction is formed in a bottom wafer in correspondence with a unit pixel of a top wafer in a stack chip package image sensor having a coupling structure of the two chips, so that a chip size is not increased and a light receiving area is not reduced.

Furthermore, the capacitor for noise reduction is connected between a power supply connected to a unit pixel of the image sensor and a ground terminal, so that it is possible to efficiently prevent noise component from being added to a signal line of a pixel.

DETAILED DESCRIPTION

Exemplary embodiments will be described below in more detail with reference to the accompanying drawings. The disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

Throughout the disclosure, like reference numerals refer to like parts throughout the various figures and embodiments of the disclosure.

Figure 3:
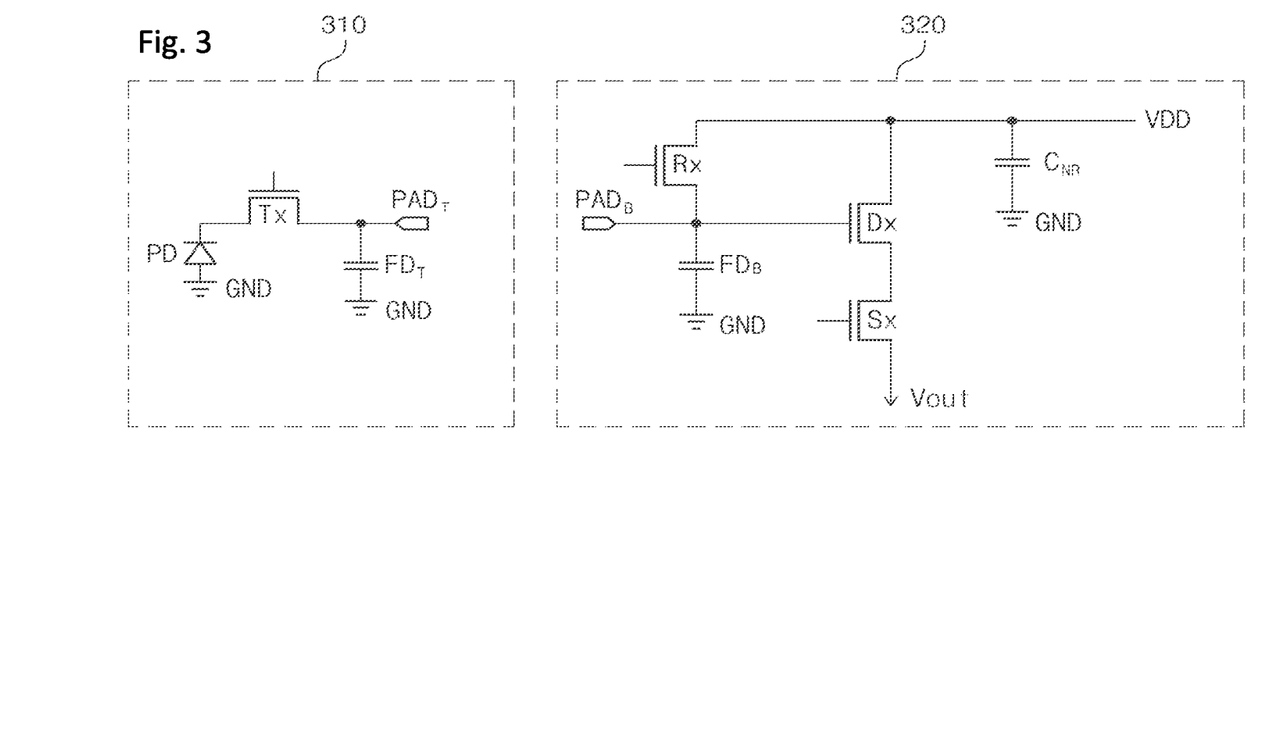
FIG. 3 is a circuit diagram of a stack chip package image sensor according to a first embodiment of the present invention.

FIG. 3 is a circuit diagram of a stack chip package image sensor according to a first embodiment of the present invention, and the stack chip package image sensor includes a first semiconductor circuit 310 and a second semiconductor circuit 320.

The first semiconductor circuit 310 includes a photodiode PD, a transmission transistor Tx, a first floating diffusion region $FD_T$, and a first conductive pad $PAD_T$.

A cathode of the photodiode PD is connected to one terminal of the transmission transistor Tx, the other terminal of the transmission transistor Tx is connected to the first conductive pad $PAD_T$, and the floating diffusion region $FD_T$ is connected between the first conductive pad $PAD_T$ and a ground terminal.

The second semiconductor circuit 320 includes a reset transistor Rx, a drive transistor Dx, a selection transistor Sx, a capacitor $C_{NR}$ for noise reduction, and a second floating diffusion region $FD_B$.

The capacitor $C_{NR}$ for noise reduction is connected between a power supply VDD connected to a unit pixel of the CMOS image sensor and the ground terminal GND, the drive transistor Dx and the selection transistor Sx are serially connected to each other between one terminal of the capacitor $C_{NR}$ for noise reduction and an output terminal Vout, the one terminal of the capacitor $C_{NR}$ for noise reduction is connected to a second conductive pad $PAD_B$ and a gate of the drive transistor Dx through the reset transistor Rx, and a connection point of the second conductive pad $PAD_B$ and the drive transistor Dx is connected to the ground terminal through the second floating diffusion region $FD_B$.

Figure 4:
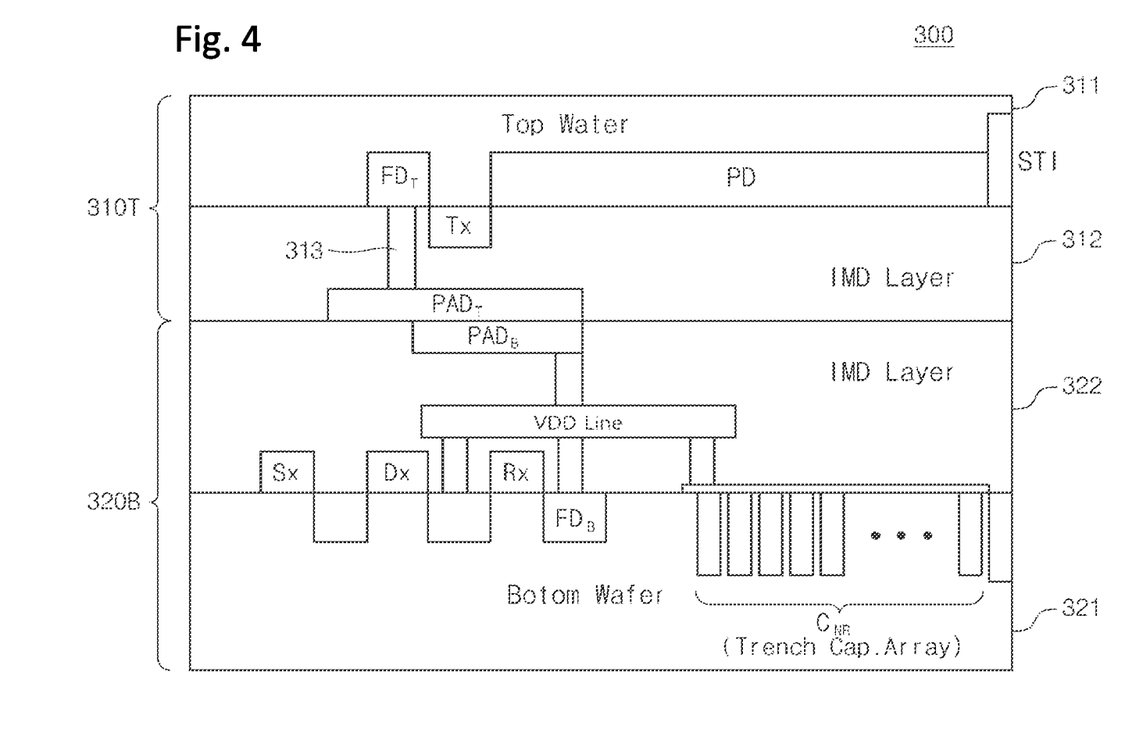
FIG. 4 is a sectional view of a stack chip package image sensor corresponding to a circuit of the stack chip package image sensor according to the present invention.

FIG. 4 is a sectional view of a stack chip package image sensor corresponding to a circuit of the stack chip package image sensor of FIG. 3.

Referring to FIG. 4, a stack chip package image sensor 300 includes a first semiconductor chip 310T having the photodiode PD, the transmission transistor Tx, the first floating diffusion region $FD_T$ and a second semiconductor chip 320B having the reset transistor Rx, the drive transistor Dx, the selection transistor Sx, the capacitor $C_{NR}$ for noise reduction, and the second floating diffusion region $FD_B$, and transmits/receives image charge through the first conductive pad $PAD_T$ installed in the first semiconductor chip 310T and the second conductive pad $PAD_B$ installed in the second semiconductor chip 320B.

In the first semiconductor chip 310T, the photodiode PD, the transmission transistor Tx, and the first floating diffusion region $FD_T$ are formed in a first wafer (Top Wafer) 311, and a first inter-metal dielectric (IMD) 312 is stacked on the upper portion of the first wafer 311. In order to improve the electrical characteristics of the image sensor, the rear surface of a wafer having passed through corresponding processes are polished to thin the thickness of the wafer, wherein the polished surface is the upper portion of the first semiconductor chip 310T. Image charge generated by the photodiode PD is transferred to the first conductive pad $PAD_T$ through the transmission transistor Tx, the first floating diffusion region $FD_T$, and a first metal line 313.

In the second semiconductor chip 320B, the reset transistor Rx, the drive transistor Dx, the selection transistor Sx, the capacitor $C_{NR}$ for noise reduction, and the second floating diffusion region $FD_B$ are formed in a second wafer (Bottom Wafer) 321, and a second inter-metal dielectric 322 is stacked on the upper portion of the second wafer 321. The capacitor $C_{NR}$ for noise reduction is a main technical factor of the present invention, is formed in a projection region of the photodiode PD, which is formed in the first wafer 311 of the first semiconductor chip 310T, in the second wafer 321 of the second semiconductor chip 320B, and is connected to a power supply line (VDD Line) through a corresponding metal line. There are various methods for forming the capacitor $C_{NR}$ for noise reduction in the second wafer 321, and in the embodiment of the present invention, the capacitor $C_{NR}$ for noise reduction is formed as a trench capacitor.

The capacitor $C_{NR}$ for noise reduction may be formed in the region in correspondence with the unit pixel of the first semiconductor chip 310T in a one-to-one manner or in a one-to-N manner.

Also in the second semiconductor chip 320B, the rear surface of a wafer having passed through corresponding processes are polished similarly to the case of the first semiconductor chip 310T, wherein the polished surface is the lower portion of the second semiconductor chip 320B. A corresponding voltage is output from the drive transistor Dx in correspondence with the image charge received in the gate of the drive transistor Dx through the first conductive pad $PAD_T$ and the second conductive pad $PAD_B$, and is transferred to a corresponding pixel through the selection transistor Sx and a metal line (not illustrated).

As illustrated in FIG. 4, the first semiconductor chip 310T is turned over and is stacked on the second semiconductor chip 320B such that the corresponding pads $PAD_T$ and $PAD_B$ of the first semiconductor chip 310T and the second semiconductor chip 320B are electrically connected to each other, so that the stack chip package according to the present invention is achieved.

In FIG. 4, the second floating diffusion region $FD_B$ is connected to the other terminal of the reset transistor Rx and the second conductive pad $PAD_B$ of the second semiconductor chip 320B. The other terminal of the reset transistor Rx is connected to the one terminal of the capacitor $C_{NR}$ for noise reduction. The capacitor $C_{NR}$ for noise reduction is not connected to the second floating diffusion region $FD_B$ and the second conductive pad $PAD_B$.

Figure 5:
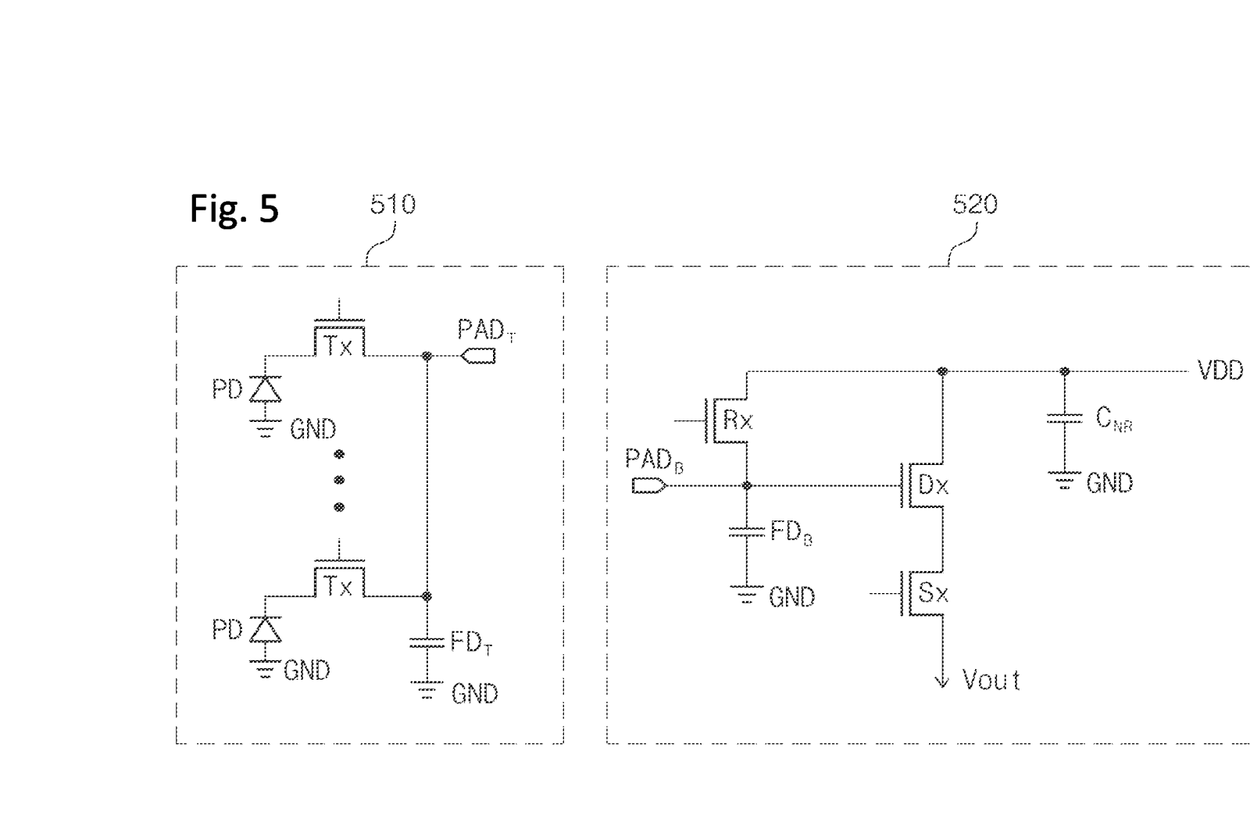
FIG. 5 is a circuit diagram of a stack chip package image sensor according to a second embodiment of the present invention.

FIG. 5 is a circuit diagram of a stack chip package image sensor according to a second embodiment of the present invention. FIG. 3 illustrates a stack chip package image sensor having a single pixel structure, but FIG. 5 illustrates a stack chip package image sensor having a shared pixel structure. That is, when comparing FIG. 5 with FIG. 3, a second semiconductor circuit 520 of FIG. 5 is the same as the second semiconductor circuit 320 of FIG. 3. However, the first semiconductor circuit 310 of FIG. 3 has a structure in which one set including the photodiode PD and the transmission transistor Tx serially connected to each other is connected to the first conductive pad $PAD_T$, but a first semiconductor circuit 510 of FIG. 5 has a structure in which a plurality of sets including photodiodes PD and transmission transistors Tx serially connected to each other are commonly connected to a first conductive pad $PAD_T$.

Figure 6:
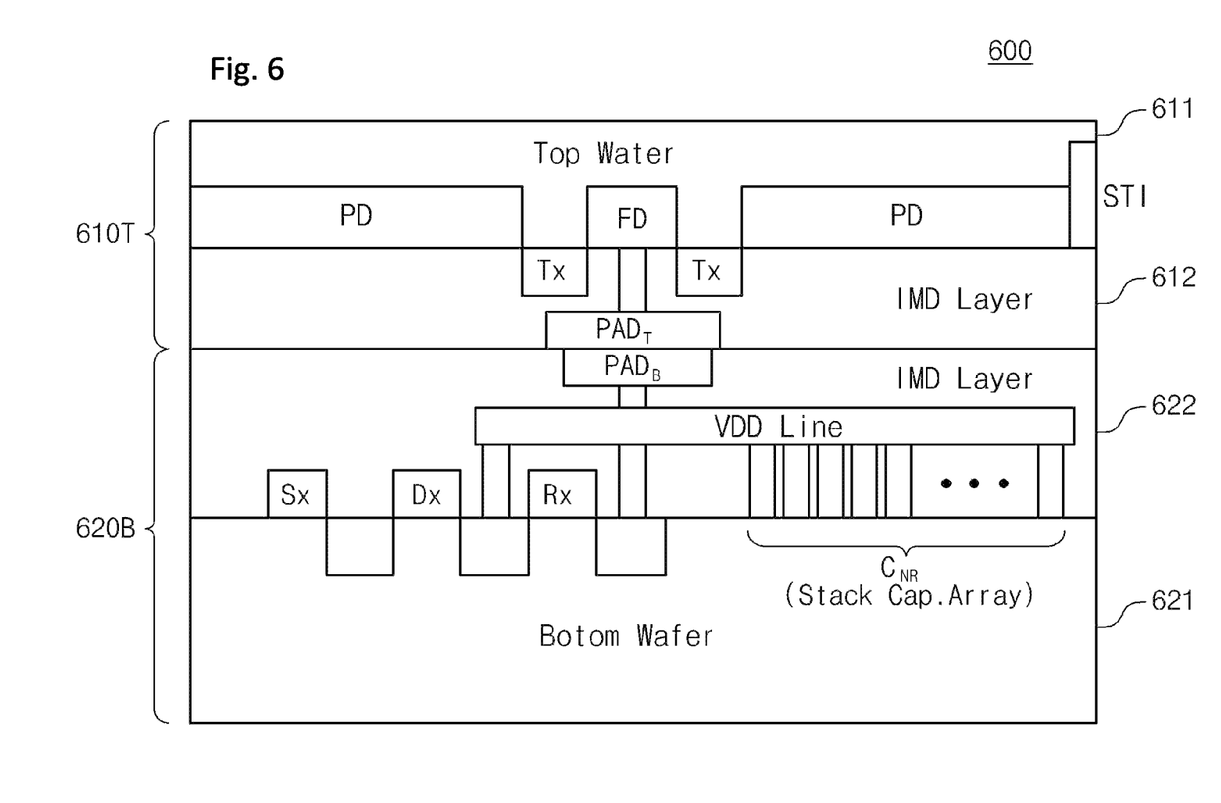
FIG. 6 is a sectional view of a stack chip package image sensor according to a second embodiment of the present invention.

FIG. 6 is a sectional view of the stack chip package image sensor according to the second embodiment of the present invention. When comparing FIG. 6 with FIG. 4, FIG. 6 is different from FIG. 4 in that the capacitor $C_{NR}$ for noise reduction is formed in a projection region of a photodiode PD, which is formed in a wafer 611 of a first semiconductor chip 610T, as a stack capacitor in an inter-metal dielectric 622 of a second semiconductor chip 620B.

Figure 7:
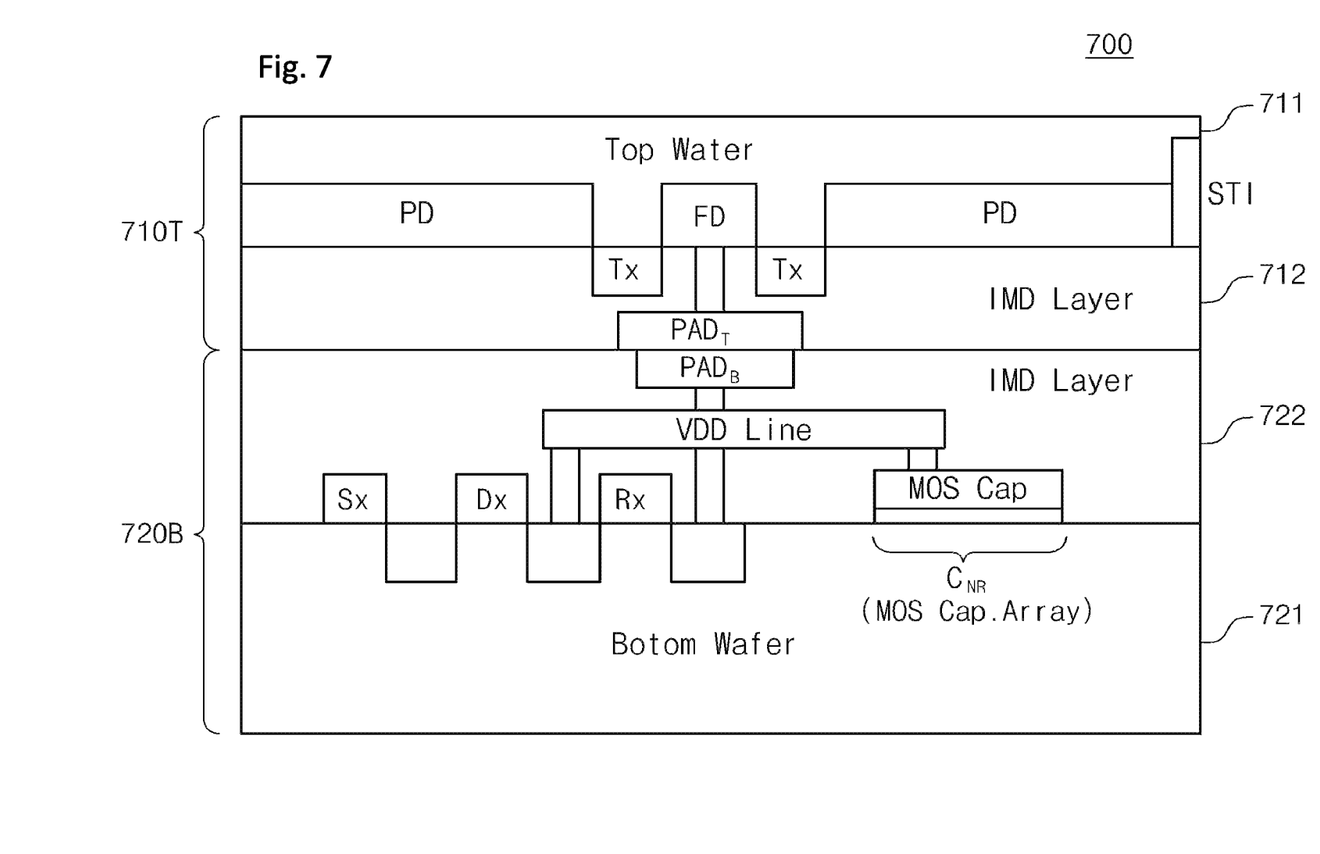
FIG. 7 is a sectional view of a stack chip package image sensor according to a third embodiment of the present invention.

FIG. 7 is a sectional view of a stack chip package image sensor according to a third embodiment of the present invention. When comparing FIG. 7 with FIG. 6, FIG. 7 is different from FIG. 6 in that the capacitor $C_{NR}$ for noise reduction is formed as a MOS capacitor.

Figure 8:
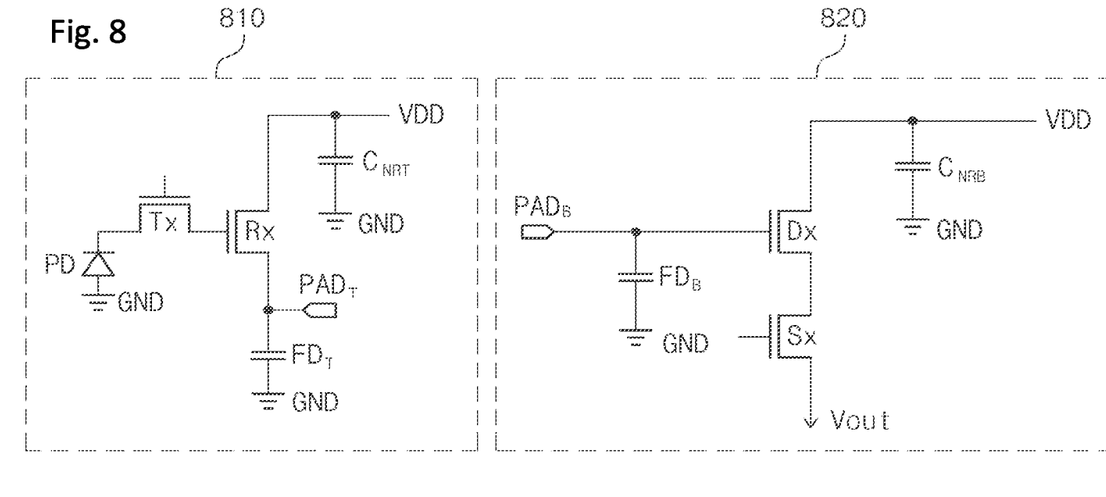
FIG. 8 is a circuit diagram of a stack chip package image sensor according to a fourth embodiment of the present invention.

FIG. 8 is a circuit diagram of a stack chip package image sensor according to a fourth embodiment of the present invention. When comparing FIG. 8 with FIG. 3, FIG. 8 is different from FIG. 3 in that the reset transistor Rx is formed in a first semiconductor circuit 810 instead of a second semiconductor circuit 820. Furthermore, FIG. 8 is different from FIG. 3 in that a first capacitor $C_{NRT}$ for noise reduction is formed in the first semiconductor circuit 810 and a second capacitor $C_{NRB}$ for noise reduction is formed in the second semiconductor circuit 820, wherein the first and second capacitors $C_{NRT}$ and $C_{NRB}$ for noise reduction may be formed in a MIM (Metal Insulator Metal) or MOM (Metal On Metal) capacitor structure.

Figure 9:
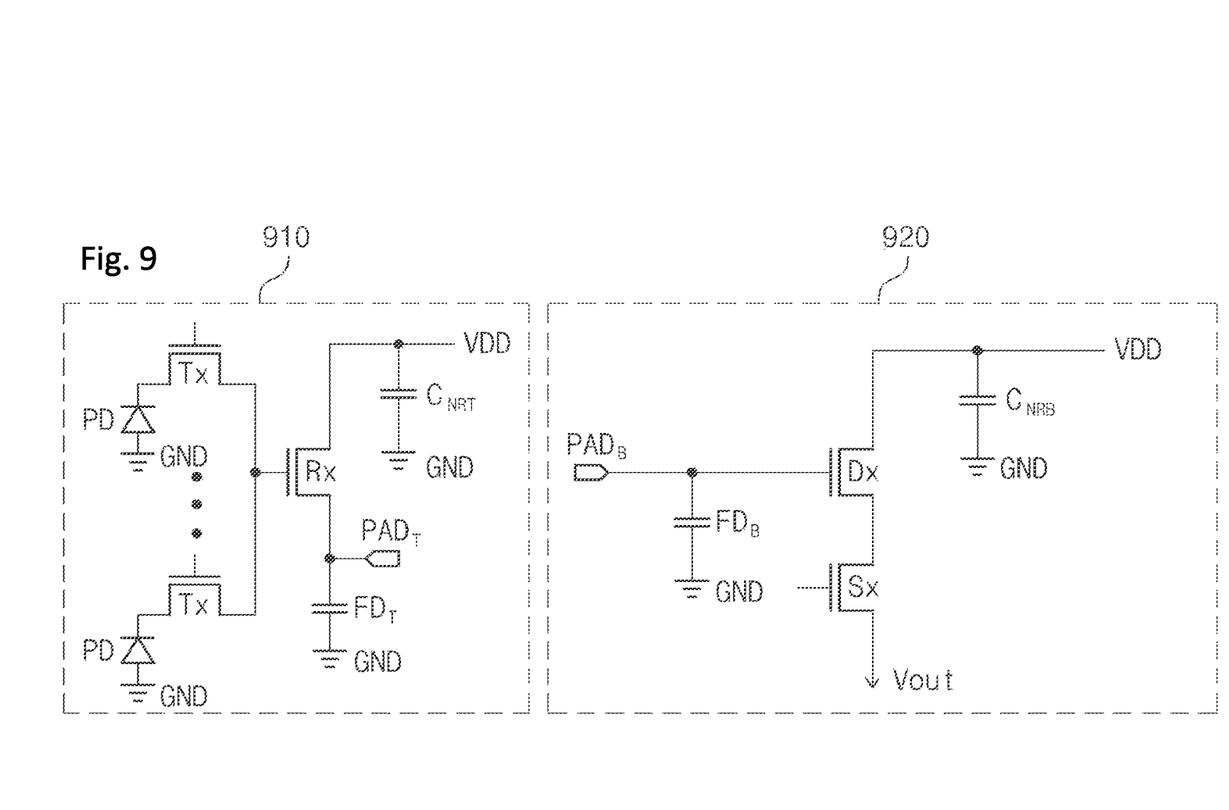
FIG. 9 is a circuit diagram of a stack chip package image sensor according to a fifth embodiment of the present invention.

FIG. 9 is a circuit diagram of a stack chip package image sensor according to a fifth embodiment of the present invention. When comparing FIG. 9 with FIG. 8, FIG. 9 is different from FIG. 8 in that a plurality of photodiodes PD and a plurality of transmission transistors Tx serially connected to each other are formed and are commonly connected to the gate of the reset transistor Rx.

In the present invention, implementation examples of the capacitor for noise reduction are not limited to the capacitor, and the capacitor for noise reduction may be implemented with structures of various capacitors and these capacitors may be stacked.

While various embodiments have been described above, it will be understood to those skilled in the art that the embodiments described are by way of example only. Accordingly, the disclosure described herein should not be limited based on the described embodiments.

What is claimed is:

1. A stack chip package image sensor comprising:
   a first semiconductor chip that includes a photodiode, a transmission transistor, a first floating diffusion region and a first conductive pad,
   wherein the photodiode outputs an image charge through the first conductive pad, and
   wherein the first floating diffusion region is connected between the first conductive pad and a ground terminal; and
   a second semiconductor chip that includes a drive transistor, a selection transistor, a reset transistor, a capacitor for noise reduction, a second floating diffusion region and a second conductive pad, and supplies a corresponding pixel with an output voltage corresponding to the image charge received from the first semiconductor chip through the second conductive pad,
   wherein the
   capacitor for noise reduction reduces a noise component added to the output voltage supplied to the pixel, and
   wherein the reset transistor is connected to one terminal of the capacitor, and the second floating diffusion region is connected to the other terminal of the reset transistor and the second conductive pad, such that the capacitor is not directly connected to the second floating diffusion region and the second conductive pad.

2. The stack chip package image sensor according to claim 1, wherein the first semiconductor chip and the second semiconductor chip are formed in a stack structure.

3. The stack chip package image sensor according to claim 1, wherein the photodiode and the transmission transistor of the first semiconductor chip are serially connected to each other and are connected to the first conductive pad.

4. The stack chip package image sensor according to claim 1, wherein the first semiconductor chip includes a plurality of photodiodes and a plurality of transmission transistors, which are serially connected to each other, and the plurality of photodiodes and the plurality of transmission transistors serially connected to each other are commonly connected to the first conductive pad.

5. The stack chip package image sensor according to claim 1, wherein the first semiconductor chip comprises:
   a first wafer including the photodiode; and
   a first inter-metal dielectric that includes a metal line, the transmission transistor, and the first conductive pad for outputting the image charge output from the photodiode to the second semiconductor chip, and is coupled with the first wafer.

6. The stack chip package image sensor according to claim 1, wherein the second semiconductor chip comprises:
   a second wafer including the capacitor for noise reduction; and
   a second inter-metal dielectric including the drive transistor, the selection transistor, and the reset transistor for supplying the corresponding pixel with the output voltage corresponding to the image charge received from the first semiconductor chip.

7. The stack chip package image sensor according to claim 1, wherein the capacitor for noise reduction is connected between a power supply and a ground terminal.

8. The stack chip package image sensor according to claim 1, wherein the drive transistor and the selection transistor are serially connected to each other between one terminal of the capacitor for noise reduction and a terminal of the output voltage.

9. The stack chip package image sensor according to claim 1, wherein the capacitor for noise reduction is formed in a projection region of the photodiode and is connected to a power supply through a metal line.

10. The stack chip package image sensor according to claim 1, wherein the capacitor for noise reduction includes at least one of a trench capacitor, a stack capacitor, and a MOS capacitor.

11. The stack chip package image sensor according to claim 1, wherein the capacitor for noise reduction is formed in a unit pixel of the first semiconductor chip in a one-to-one manner or in a one-to-N manner.

* * * * *